(12) United States Patent
Kwon et al.

(10) Patent No.: US 8,410,517 B2
(45) Date of Patent: Apr. 2, 2013

(54) LIGHT EMITTING DIODE COATING METHOD

(75) Inventors: Sunghoon Kwon, Seoul (KR); Euijoon Yoon, Seoul (KR); Wook Park, Seoul (KR)

(73) Assignee: SNU R&DB Foundation, Seoul (KR)

( * ) Notice: Subject to any disclaimer, the term of this patent is extended or adjusted under 35 U.S.C. 154(b) by 119 days.

(21) Appl. No.: 12/811,794

(22) PCT Filed: Jan. 6, 2009

(86) PCT No.: PCT/KR2009/000038
§ 371 (c)(1),
(2), (4) Date: Jul. 6, 2010

(87) PCT Pub. No.: WO2009/088198
PCT Pub. Date: Jul. 16, 2009

(65) Prior Publication Data
US 2010/0276716 A1    Nov. 4, 2010

(30) Foreign Application Priority Data
Jan. 7, 2008    (KR) ........................ 10-2008-0001861

(51) Int. Cl.
*H01L 33/00*    (2010.01)
*H01L 21/00*    (2006.01)

(52) U.S. Cl. ................................ 257/100; 257/E33.068
(58) Field of Classification Search .................. 257/100, 257/E33.068, 98, E23.116; 438/29
See application file for complete search history.

(56) References Cited

U.S. PATENT DOCUMENTS

| | | | |
|---|---|---|---|
| 6,756,186 B2 | 6/2004 | Collins, III et al. | |
| 6,963,166 B2 * | 11/2005 | Yano et al. | 313/498 |
| 7,372,198 B2 | 5/2008 | Negley | |
| 7,847,302 B2 * | 12/2010 | Basin et al. | 257/88 |
| 7,939,350 B2 * | 5/2011 | Tsai | 438/28 |
| 2004/0173806 A1 | 9/2004 | Chua | |

FOREIGN PATENT DOCUMENTS
WO    WO02-067054    8/2002

* cited by examiner

*Primary Examiner* — William D Coleman
(74) *Attorney, Agent, or Firm* — Sherr & Jiang, PLLC

(57) ABSTRACT

Provided is a light emitting diode (hereinafter, referred to as an LED) coating method, and more particularly, an LED coating method that can be used to coat a phosphor, a molding, etc., on an LED.
The LED coating method includes (a) preparing a substrate and a plurality of LEDs arranged on the substrate; (b) applying a photoresist onto the substrate and the plurality of LEDs; and (c) selectively exposing the photoresist to light to form a first coating on surfaces of the plurality of LEDs. Here, the first coating is formed by curing the photoresist.

40 Claims, 11 Drawing Sheets

(a)

(b)

(c)

(a)

(b)

(c)

(a)

(b)

(c)

(a)

(b)

(c)

LIGHT EMITTING DIODE COATING METHOD

CROSS REFERENCE TO PRIOR APPLICATIONS

This application is a National Stage Patent Application of International Patent Application No. PCT/KR2009/000038 (filed on Jan. 6, 2009) under 35 U.S.C. §371, which claims priority to Korean Patent Application No. 10-2008-0001861 (filed on Jan. 7, 2008), which are both hereby incorporated by reference in their entirety.

TECHNICAL FIELD

The present invention relates to a light emitting diode (hereinafter, referred to as LED) coating method, and more particularly, an LED coating method that can be used to coat a phosphor, a molding, etc., on an LED.

BACKGROUND ART

A conventional technique for coating a phosphor on an LED, as shown in FIG. 1, includes directly applying a polymer material 20 such as epoxy, etc., into which the phosphor is mixed, onto an LED 10, and then, curing the polymer material 20.

The conventional method of coating a phosphor on an LED has a problem that the polymer material 20 including the phosphor cannot be easily patterned. Therefore, in the conventional phosphor coating method, the phosphor must be applied to the entire surface after completion of wire bonding. In this case, when the LED to which the phosphor is applied cannot have desired performance (for example, in color, uniformity of color, etc.), the LED, which is expensive due to the wire bonding, is wasted, and thus, the overall manufacturing cost increases.

In addition, the conventional method of coating a phosphor on the LED 10 is not appropriate for mass production. More specifically, in the conventional phosphor coating method, since the polymer material 20 including the phosphor must be separately coated onto each LED, the coating is expensive.

Further, the conventional method of coating a phosphor on the LED 10 has a problem in that the thickness of the polymer material 20 including the phosphor cannot be easily adjusted. When the thickness of the polymer material 20 including the phosphor increases, intensity of light having a frequency varied by the phosphor increases, and when the thickness of the polymer material 20 including the phosphor decreases, intensity of light having a frequency varied by the phosphor decreases. Therefore, since the thickness of the polymer material 20 including the phosphor is an important factor for determining colors finally obtained from the LED 10, the thickness must be precisely controlled. In particular, since the light is emitted from side surfaces of the LED 10 as well as an upper surface thereof, the thickness of the polymer material 20 including the phosphor disposed on the side surfaces of the LED 10 as well as the thickness of the polymer material 20 including the phosphor disposed on the upper surface of the LED 10 must be precisely controlled.

Furthermore, since the polymer material 20 including the phosphor is applied onto the LED 10 to a non-uniform thickness in the conventional method of coating a phosphor on the LED 10, uniform colors cannot be obtained. For example, when a white light is obtained by mixing a blue light emitted from a blue LED 10 and a yellow light obtained by a yellow phosphor, the white light with yellow color is transmitted to an observer 1 of FIG. 1 since the thickness of the polymer material 20 including the phosphor is large, and the white light with blue color is transmitted to an observer 2 of FIG. 1 since the thickness of the polymer material 20 including the phosphor is small.

DISCLOSURE

Technical Problem

In order to solve the foregoing and/or other problems, it is an object of the present invention to provide a method of coating a phosphor, a molding, etc., on an LED.

It is another object of the present invention to provide an LED coating method of patterning a phosphor, a molding, etc.

It is still another object of the present invention to provide an LED coating method of coating an LED at a lower cost than that of a conventional art.

It is yet another object of the present invention to provide an LED coating method of easily adjusting the thickness of a phosphor, a molding, etc.

It is yet another object of the present invention to provide an LED coating method of uniformly coating a phosphor, a molding, etc.

Technical Solution

A first aspect of the present invention provides an LED coating method including: (a) preparing a substrate and a plurality of LEDs arranged on the substrate; (b) applying a photoresist onto the substrate and the plurality of LEDs; and (c) selectively exposing the photoresist to light to form a first coating on surfaces of the plurality of LEDs, wherein the first coating is formed by curing the photoresist.

A second aspect of the present invention provides an LED coating method including: (a) preparing a substrate, a plurality of LEDs arranged on the substrate, and a board; (b) introducing a photoresist into between the substrate and the board disposed parallel to each other to sandwich the plurality of LEDs; and (c) selectively exposing the photoresist to light to form a first coating on surfaces of the plurality of LEDs, wherein the first coating is formed by curing the photoresist.

A third aspect of the present invention provides an LED light source including: a substrate; an LED disposed on the substrate; and a coating for covering at least a portion of the LED, the coating including a cured photoresist.

Advantageous Effects

An LED coating method in accordance with the present invention has an advantage of coating a phosphor, a molding, etc., on an LED.

In addition, an LED coating method in accordance with the present invention has an advantage of patterning a phosphor, a molding, etc.

Further, an LED coating method in accordance with the present invention has an advantage of coating an LED at a low cost.

Furthermore, an LED coating method in accordance with the present invention has an advantage of easily adjusting the thickness of a phosphor, a molding, etc., coated on an LED.

In addition, an LED coating method in accordance with the present invention has an advantage of uniformly applying a phosphor, a molding, etc., onto an LED.

DESCRIPTION OF DRAWINGS

The above and other objects, features and advantages of the present invention will be more apparent from the following detailed description taken in conjunction with the accompanying drawings, in which:

FIGS. 15 and 16 are views for explaining a modified example of the LED coating method in accordance with the second exemplary embodiment of the present invention, wherein FIG. 15 shows a board 130B having a non-flat surface in contact with a photoresist 140, and FIG. 16 shows a coating 142A obtained when a coating process is performed using the board 130B of FIG. 15.

MODES FOR INVENTION

FIGS. 2 to 5 are views for explaining steps of an LED coating method in accordance with a first exemplary embodiment of the present invention.

Figure 1:
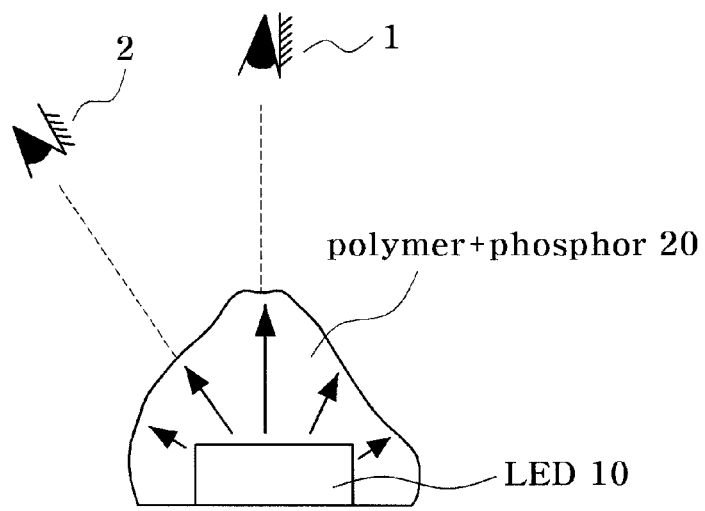
FIG. 1 is a view for explaining a conventional technique of coating a phosphor on an LED, showing a method of directly applying a polymer material 20 such as epoxy, with which a phosphor is mixed, onto an LED 10, and curing the polymer material 20.
Figure 2:
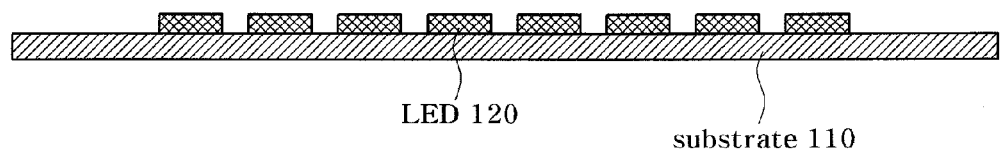
FIGS. 2 to 5 are views for explaining steps of an LED coating method in accordance with a first exemplary embodiment of the present invention.

Referring to FIG. 2, a substrate 110, and a plurality of LEDs 120 arranged on the substrate 110 are prepared.

Various kinds of substrates, for example, a semiconductor substrate (e.g., a silicon substrate), a glass substrate, a plastic substrate and a circuit board (e.g., a printed circuit board (PCB)) may be used as the substrate 110.

Various kinds of LEDs including at least one of a blue LED, a red LED, a green LED, and an ultraviolet LED may be used as the plurality of LEDs.

Figure 3:
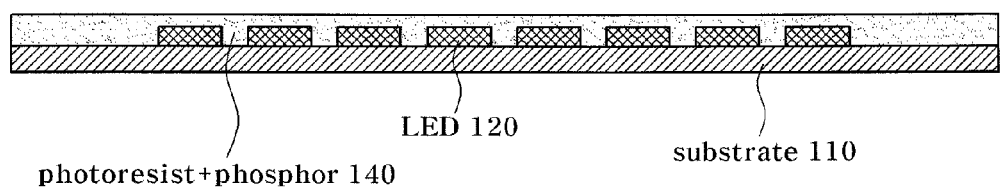

Referring to FIG. 3, a photoresist 140 is applied onto the substrate 110 and the plurality of LEDs 120.

Various kinds of photoresists including a positive resist and a negative resist may be used as the photoresist 140. The photoresist 140 may not include a phosphor. In this case, a coating 142 formed by curing the photoresist 140 may be used as a transparent layer, a molding, or the like. The photoresist 140 may include a phosphor. Various kinds of phosphors including at least one of a red phosphor, a green phosphor, a blue phosphor, and a yellow phosphor may be used as the phosphor.

The photoresist 140 may be applied onto the substrate 110 through various methods. For example, the photoresist 140 may be applied through a method of dipping the substrate 110, on which the plurality of LEDs 120 are arranged, into a container including a solution of the photoresist 140. As another example, the photoresist 140 may be applied through a method of spraying a solution of the photoresist 140 on the substrate 110. As still another example, the photoresist 140 may be applied through a method of spin coating using a spin coater.

Figure 4:
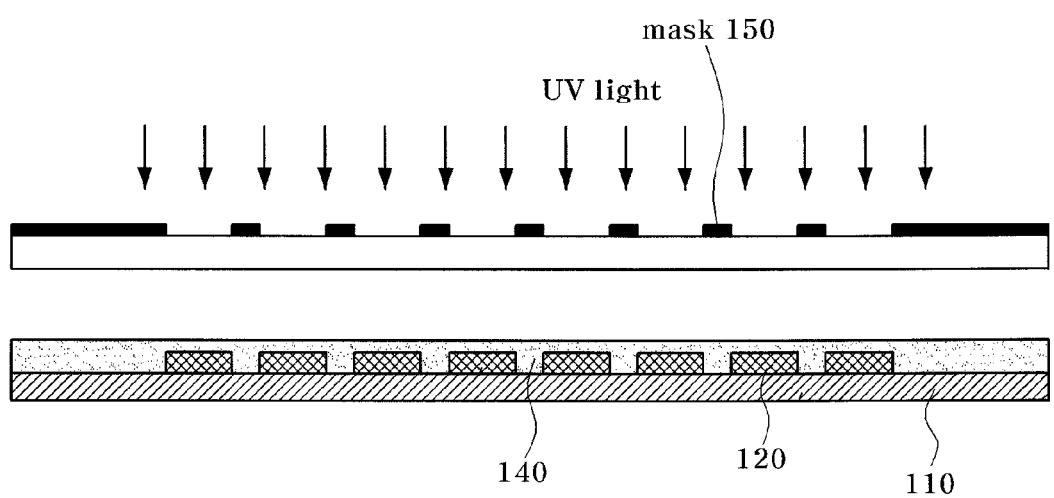

Referring to FIG. 4, the photoresist 140 is selectively exposed.

While the drawings illustrate an example of selectively providing light to the photoresist 140 using a mask 150, various other methods capable of selectively providing light to the photoresist 140 may be used.

The drawings illustrate an example of irradiating ultraviolet light, but the present invention is not limited thereto. While the drawings illustrate an example in which a negative resist is used, a positive resist may be used. When the positive resist is used, unlike the drawing, the mask 150 should be manufactured to block light at a region in which the coating 142 is to be formed and to transmit light at other regions.

Figure 5:
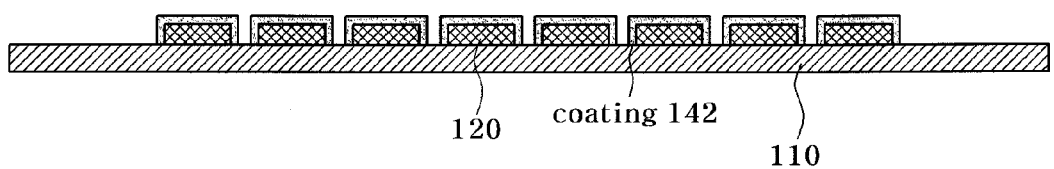

Referring to FIG. 5, the photoresist 140 is developed to form the coating 142 on the surfaces of the plurality of LEDs 120. The coating 142 corresponds to the cured photoresist 140.

When the LEDs are coated according to the above-mentioned method, the phosphor or the molding coated on the LEDs may be patterned, and a wire bonding process may be performed after the coating. In addition, since the plurality of LEDs can be simultaneously coated when the LEDs are coated according to the above-mentioned method, cost consumption for the coating process can be reduced. Further, since the thickness of the coating at side surfaces of the LEDs can be adjusted when the LEDs are coated according to the above-mentioned method, colors of light emitted from the side surfaces of the LEDs can be more precisely adjusted.

Figure 6:
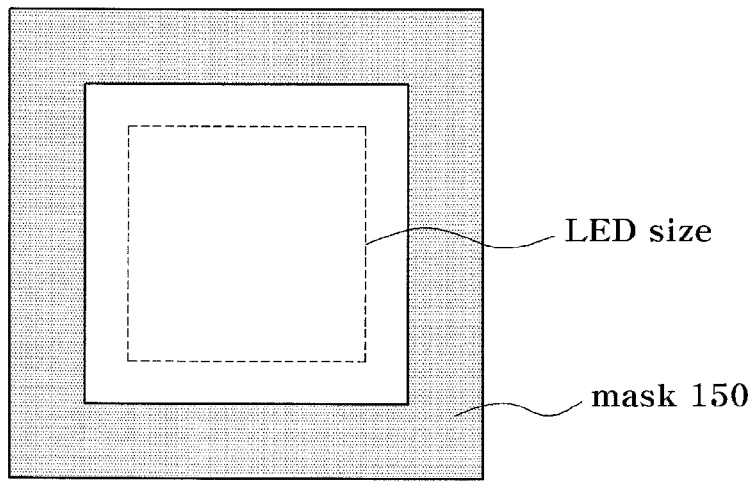
FIGS. 6 to 8 are views for explaining adjustment of shapes of a coating 142 and coating thicknesses of side surfaces of the LED 120 depending on shapes of a mask 150.
Figure 6:
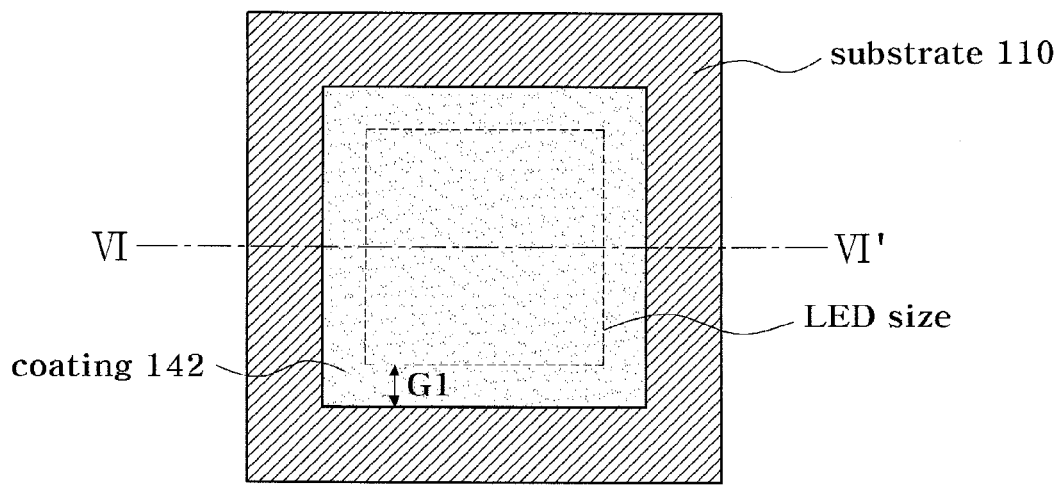
Figure 6:
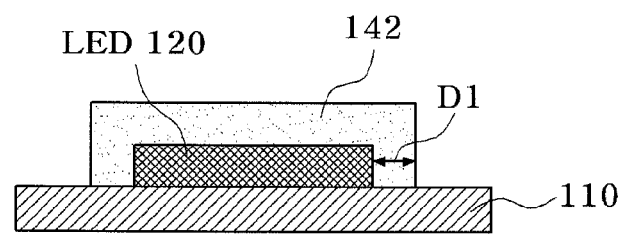
Figure 7:
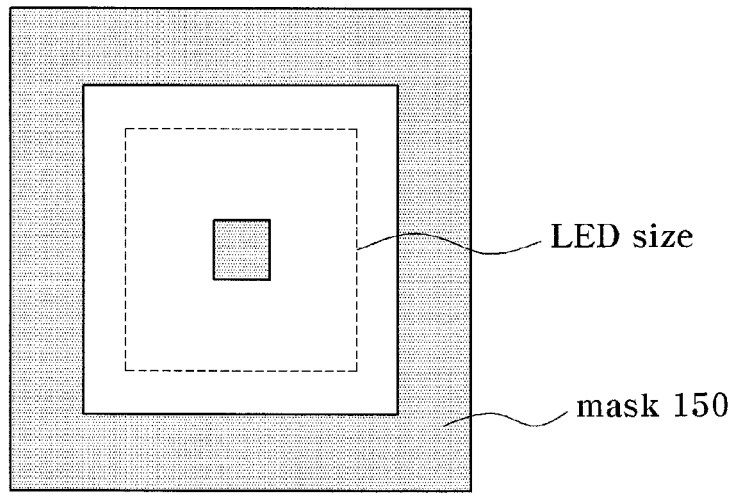
Figure 7:
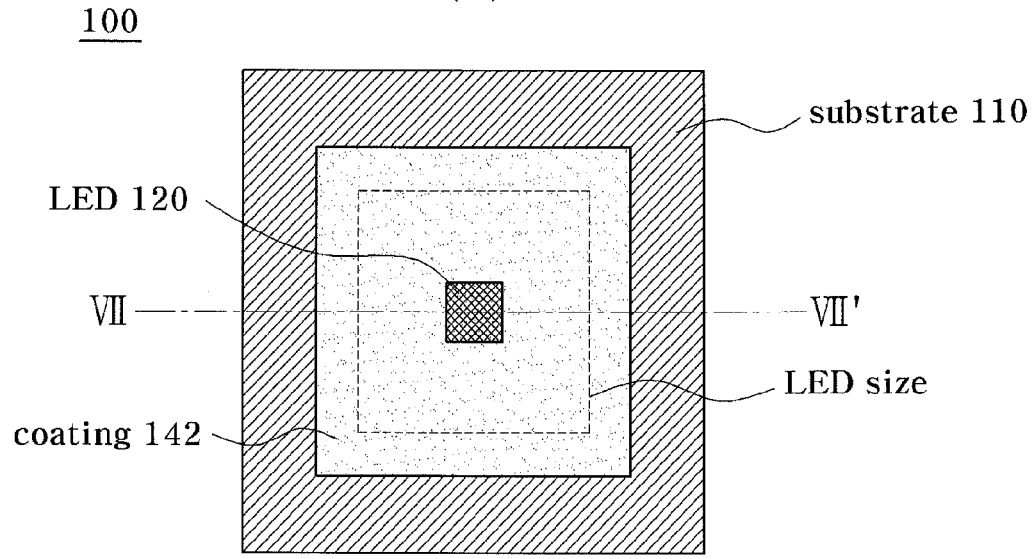
Figure 7:
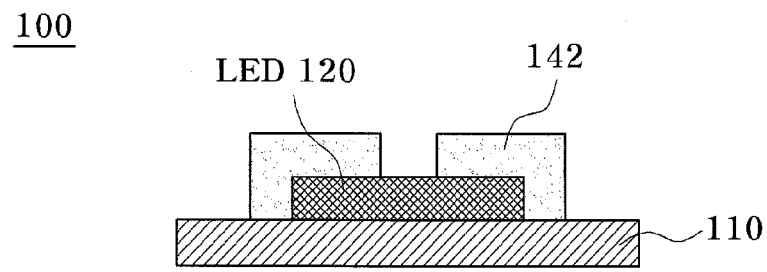
Figure 8:
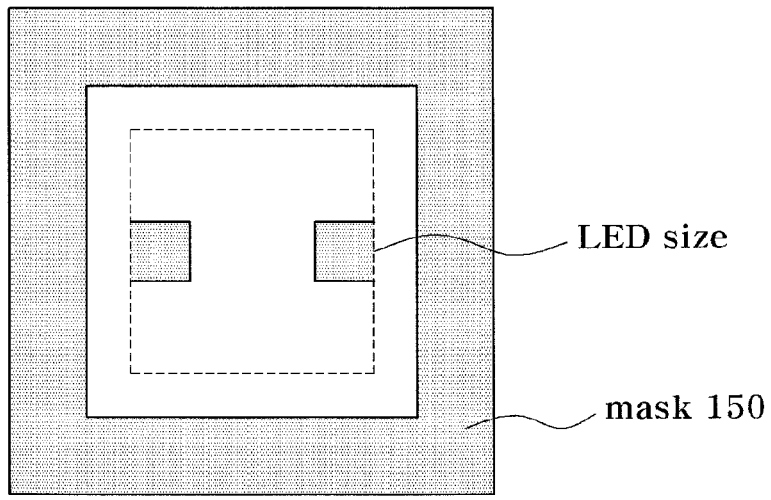
Figure 8:
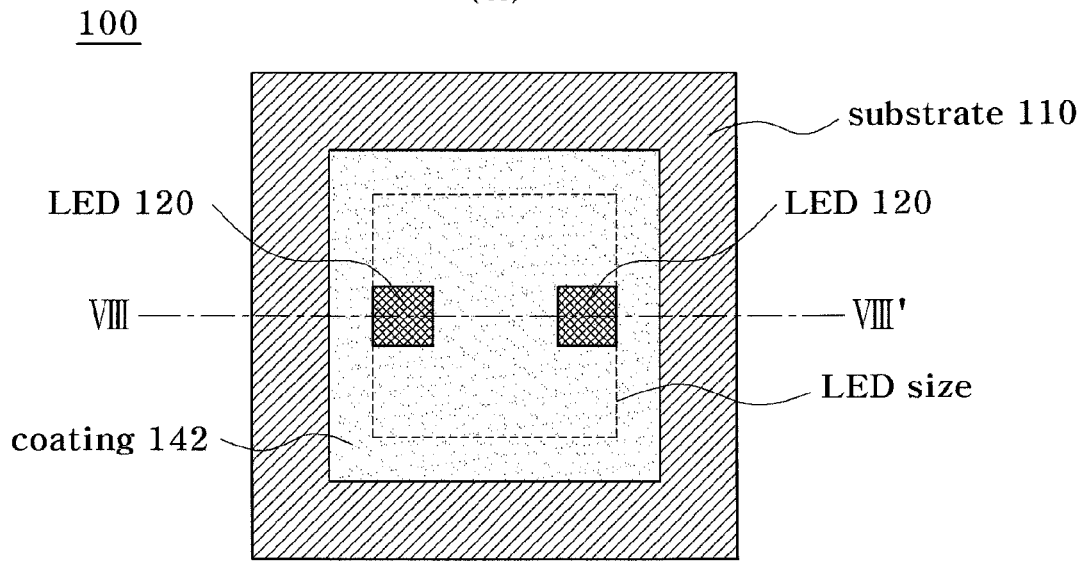
Figure 8:
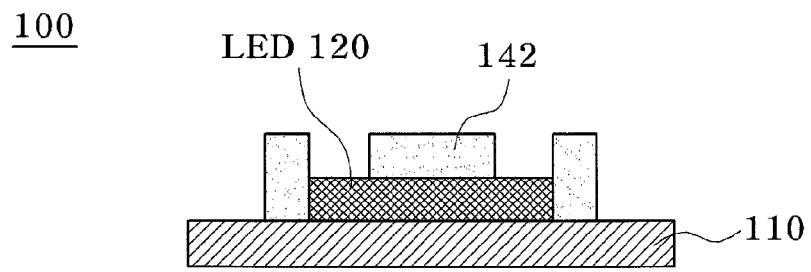

FIGS. 6 to 8 are views for explaining adjustment of shapes of the coating 142 and coating thicknesses of side surfaces of the LED 120 depending on shapes of the mask 150. In FIGS. 6 to 8, (a) shows the shape of the mask 150, and (b) and (c) show a plan view and a cross-sectional view of an LED light source 100 formed when the mask 150 shown in (a) is used, respectively.

When the mask 150 of (a) of FIG. 6 is used, the coating 142 covering an upper surface and side surfaces of the LED 120 as shown in (b) and (c) of FIG. 6 is formed.

In the drawings, the thickness of the coating 142 disposed at the side surfaces of the LED 120 is determined by the shape of the mask 150. For example, provided that the photoresist 140 is not expanded or contracted during curing thereof, a thickness D1 of the coating 142 disposed at the side surfaces of the LED 120 is a horizontal gap G1 between the LED 120 and the mask 150. Therefore, when the LED 120 is coated according to the present invention, it is possible to readily adjust the thickness of the coating 142 disposed at the side surfaces of the LED 120 by adjusting the gap between the LED 120 and the mask 150.

When the mask 150 shown in (a) of FIGS. 7 and 8 is used, the coating 142 covering the remaining regions other than a portion of the upper surface of the LED 120 is formed as shown in (b) and (c) of FIGS. 7 and 8.

In FIGS. 7 and 8, the portion in which the coating 142 is not formed may be used to contact a bonding wire (not shown) in the following process.

FIGS. 9 to 12 are views for explaining steps of an LED coating method in accordance with a second exemplary embodiment of the present invention.

Figure 9:
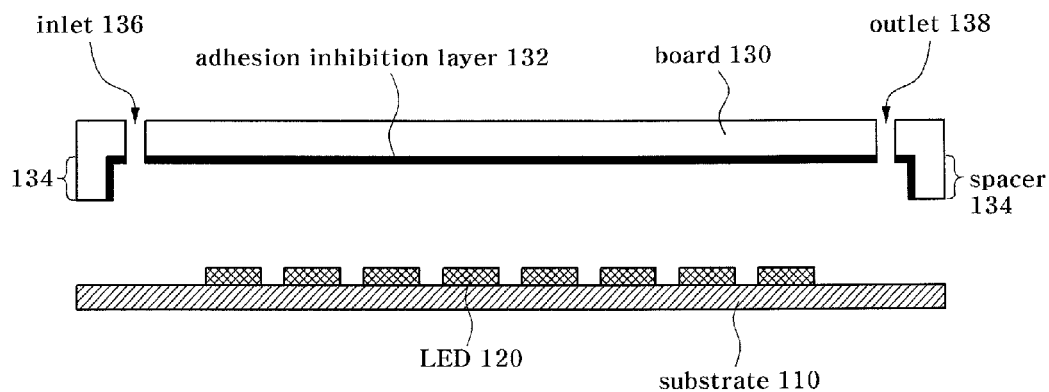
FIGS. 9 to 12 are views for explaining steps of an LED coating method in accordance with a second exemplary embodiment of the present invention.

Referring to FIG. 9, a substrate 110, a plurality of LEDs 120 arranged on the substrate 110, and a board 130 are prepared.

Various kinds of substrates may be used as the substrate 110, and various kinds of LEDs may be used as the plurality of LEDs 120.

The board 130 may have a transparent region at a portion thereof or the entire region. The board 130 may be, for example, a glass board or a plastic board.

An adhesion inhibition layer 132 may be formed at a lower surface of the board 130 facing the LEDs 120. The adhesion inhibition layer 132 prevents the coating 142 obtained by curing the photoresist 140 from being adhered to the board 130 so that the board 130 can be easily separated from the coating 142. The adhesion inhibition layer 132 may be, for example, an oxygen transmission layer. The oxygen transmission layer may, for example, include a material having fine pores through which oxygen can pass. The oxygen transmission layer may be formed of, for example, polydimethylsiloxane (PDMS). When the oxygen transmission layer is used, curing of the photoresist in contact with the oxygen transmission layer is suppressed by the oxygen supplied to the surface of the oxygen transmission layer to prevent adhesion of the oxygen transmission layer to the coating 142. The adhesion inhibition layer 132 may be, for example, a hydrophobic coating layer. The hydrophobic coating layer may be, for example, Teflon.

The board 130 may include a spacer 134 to determine a size of a gap between the board 130 and the substrate 110 in the following process. The spacer 134 may be integrally formed with the board 130 as shown in the drawings, or may be separately formed from the board 130, unlike the drawings. If there is another means for precisely adjusting the size of the gap between the board 130 and the substrate 110, the spacer 134 may be omitted. The board 130 may include an inlet 136 and an outlet 138. The inlet 136 corresponds to a hole into which the photoresist 140 is injected during the following process (see FIG. 10), and the outlet 138 corresponds to a hole through which internal air is discharged while the photoresist 140 is injected. The inlet 136 and the outlet 138 may be disposed at the spacer 134, disposed on the substrate 110, or may be omitted unlike the drawings.

Figure 10:
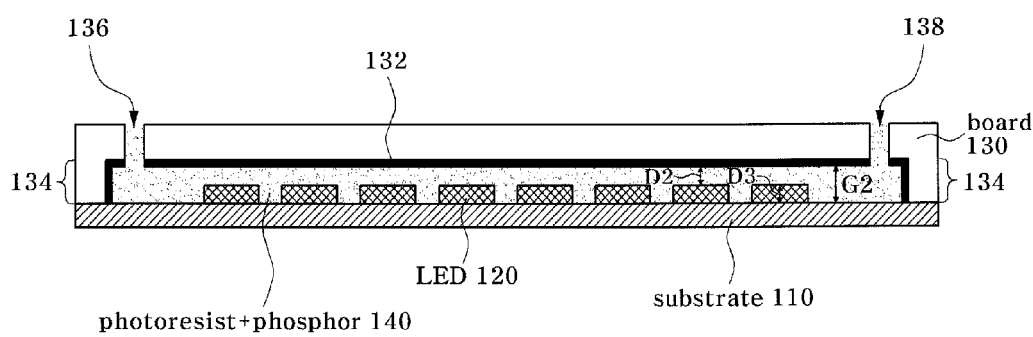

Referring to FIG. 10, the photoresist 140 is interposed between the substrate 110 and the board 130, which are disposed parallel to each other to sandwich the plurality of LEDs 120.

Various kinds of photoresists may be used as the photoresist 140. The photoresist 140 may not include a phosphor. In this case, the coating 142 formed by curing the photoresist 140 may be exemplarily used as a transparent layer or a molding. The photoresist 140 may include a phosphor. Various kinds of phosphors may be used as the phosphor.

In the following process, the thickness of the coating 142 formed by curing the photoresist 140, in particular, the thickness of the coating 142 disposed on the upper surface of the LED 120, is determined by a distance between the substrate 110 and the board 130. For example, provided that the photoresist 140 is not expanded or contracted during curing thereof, a thickness D2 of the coating 142 is a difference between a gap G2 between the substrate 110 and the board 130 and a thickness D3 of the LED 120. Therefore, when the LED is coated according to the present invention, the thickness of the coating 142 can be easily adjusted by adjusting the gap between the substrate 110 and the board 130.

In the example shown in the drawing, interposing the photoresist 140 between the substrate 110 and the board 130 may include disposing the board 130 on the substrate 110, and injecting the photoresist 140 between the substrate 110 and the board 130 through the inlet 136. In this case, a space between the board 130 and the substrate 110 is surrounded by the board 130, the substrate 110 and the spacer 134. The space is connected to the exterior space by the inlet 136 and the outlet 138.

Unlike the drawings, interposing the photoresist 140 between the substrate 110 and the board 130 may be performed by various other methods. For example, after dipping the substrate 110 and the board 130 into a container including a solution of the photoresist 140, the board 130 may be disposed on the substrate 130. As another example, after spraying a solution of the photoresist 140 onto the substrate 110, the board 130 may be disposed on the substrate 110. In these cases, there may be no need for the inlet 136 and the outlet 138, and no need to surround the entire side surfaces of the space between the board 130 and the substrate 110 by the spacer 134.

Figure 11:
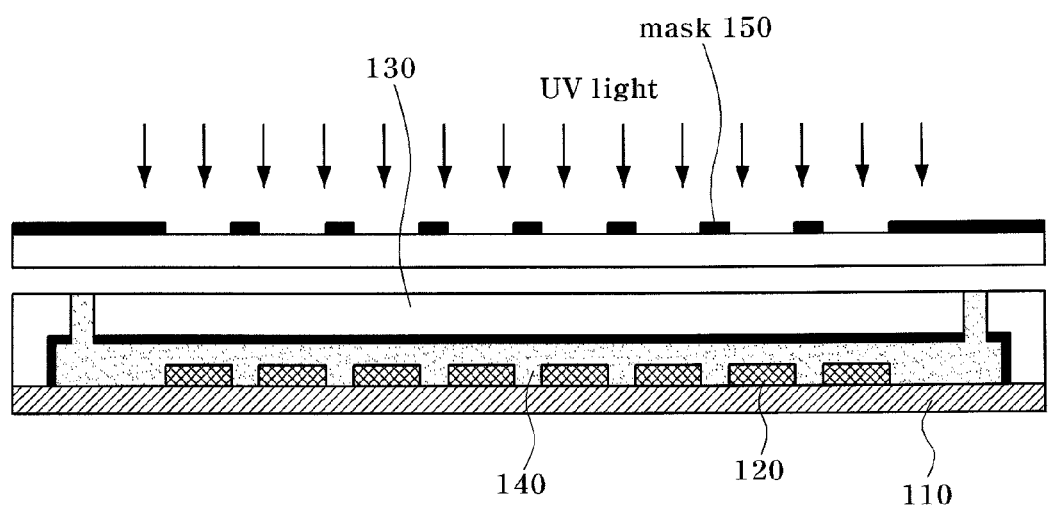

Referring to FIG. 11, the photoresist 140 is selectively exposed.

While the drawings show an example of selectively providing light to the photoresist 140 using a separate mask 150, another method of selectively providing light to the photoresist 140 may be used. For example, the mask 150 may be formed at the board 130 itself.

While the drawings show an example in which ultraviolet light is irradiated, the present invention is not limited thereto. While the drawings show an example in which a negative resist is used as the photoresist 140, a positive resist may be used. When the positive resist is used, unlike the drawings, the mask 150 must be formed to block light at a region on which the coating 142 is to be formed, and to transmit light through other regions.

Figure 12:
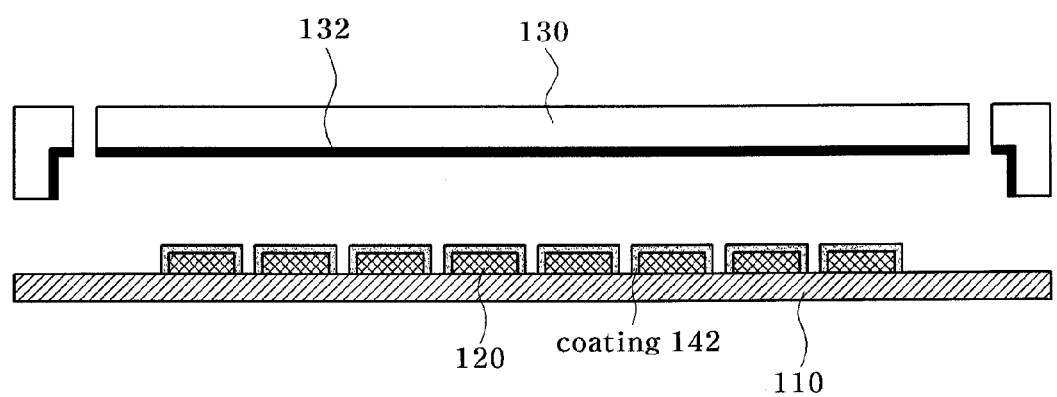

Referring to FIG. 12, after separating the board 130 from the substrate 110, the photoresist is developed to form the coating 142 on the surfaces of the plurality of LEDs 120. The coating 142 corresponds to the cured photoresist 140.

The coating method according to the second embodiment of the present invention has advantages of adjusting the thickness of the coating disposed on the upper surface of the LED and obtaining a uniform coating thickness as well as the advantages of the LED coating method of the first embodiment of the present invention.

Figure 13:
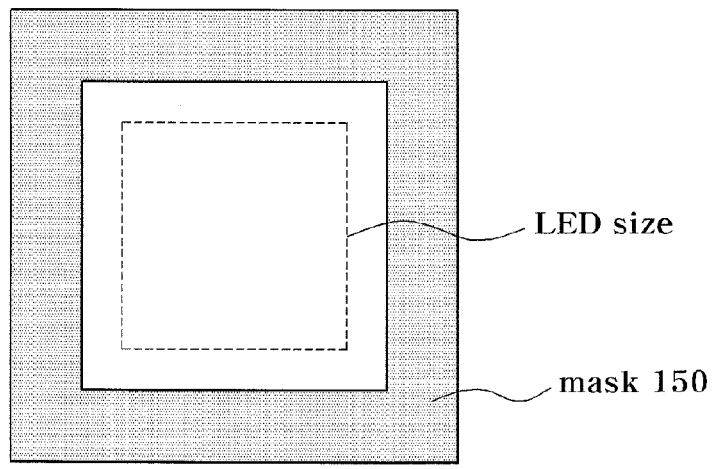
FIG. 13 is a view for explaining adjustment of a thickness of a coating 142 obtained by the second embodiment of the present invention.
Figure 13:
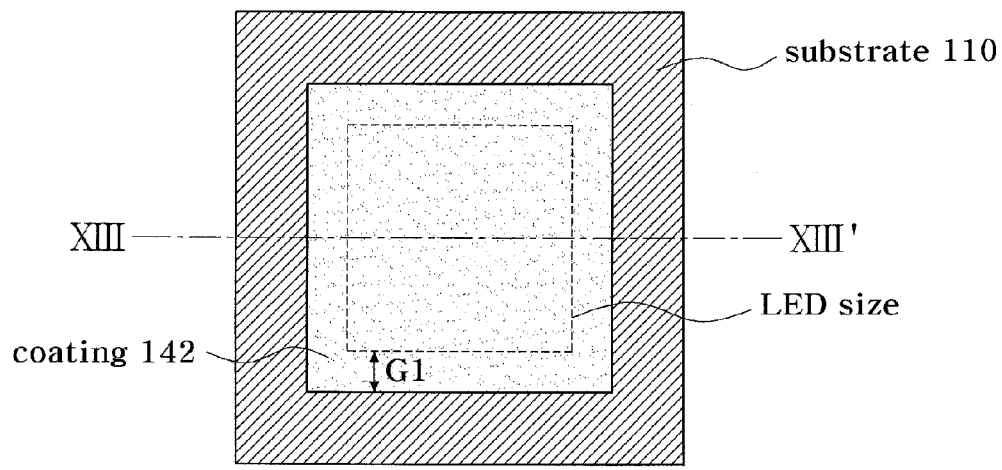
Figure 13:
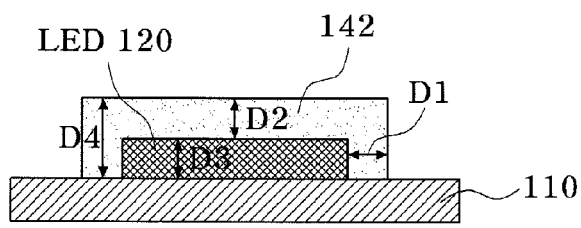

FIG. 13 is a view for explaining adjustment of a thickness of a coating 142 obtained by the second embodiment of the present invention. In FIG. 13, (a) shows the shape of the mask 150, and (b) and (c) show a plan view and a cross-sectional view of an LED light source 100 formed when the mask 150 shown in (a) is used, respectively.

In the drawings, the thickness of the coating 142 disposed at side surfaces of the LED 120 is determined by the shape of the mask 150. As described above, provided that the photoresist 140 is not expanded or contracted during curing thereof, the thickness D1 of the coating 142 disposed at the side surfaces of the LED 120 is the horizontal gap G1 between the LED 120 and the mask 150. Therefore, when the LED 120 is coated according to the present invention, the thickness of the coating 142 disposed at the side surfaces of the LED 120 can be easily adjusted by adjusting the horizontal gap between the LED 120 and the mask 150.

In addition, the thickness of the coating 142 disposed on the upper surface of the LED 120 is determined by a gap between the substrate 110 and the board 130. As described above, provided that the photoresist 140 is not expanded or contracted during curing thereof, the thickness D2 of the coating 142 is a difference between the gap G2 between the substrate 110 and the board 130 and the thickness D3 of the LED 120. Therefore, when the LED is coated according to the present invention, the thickness of the coating 142 can be easily adjusted by adjusting the gap between the substrate 110 and the board 130. Further, as can be readily seen from the drawings, the coating 142 having a uniform thickness can be obtained using the board 130.

Furthermore, a thickness D4 of the coating 142 of the drawings is determined by the gap between the substrate 110 and the board 130. For example, provided that the photoresist 140 is not expanded or contracted during curing thereof, the thickness D4 of the coating 142 is the gap G2 between the substrate 110 and the board 130. Therefore, when the LED is coated according to the present invention, the thickness D4 of the coating 142 can be easily adjusted by adjusting the gap between the substrate 110 and the board 130.

Figure 14:
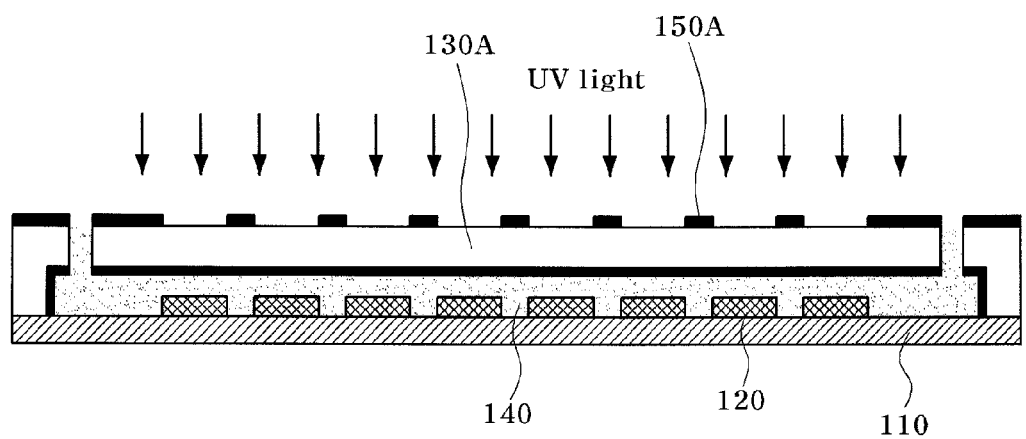
FIG. 14 is a view of a modified example of an exposure step represented in FIG. 11, showing an example in which a mask 150A is formed at a board 130A itself.

FIG. 14 is a view of a modified example of an exposure step represented in FIG. 11, showing an example in which a mask 150A is formed at a board 130A itself. Referring to FIG. 14, the mask 150A is formed as an opaque region on the upper surface of the board 130A. In this case, the separate mask 150 shown in FIG. 11 is not required.

Figure 15:
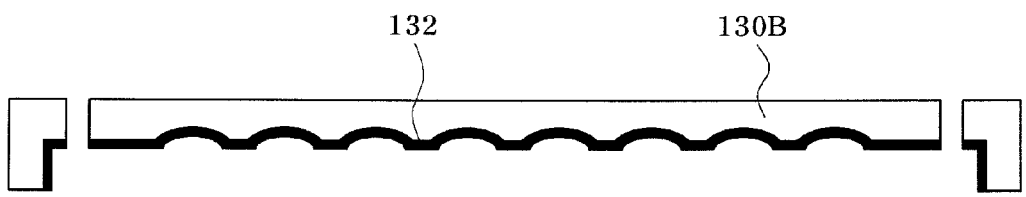
Figure 16:
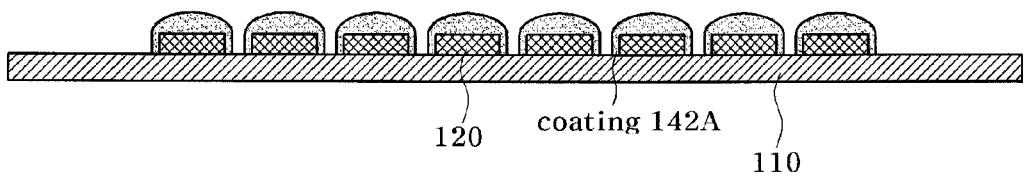

FIGS. 15 and 16 are views for explaining a modified example of the LED coating method in accordance with the second exemplary embodiment of the present invention, wherein FIG. 15 shows a board 130B having a non-flat surface in contact with a photoresist 140, and FIG. 16 shows a coating 142A obtained when a coating process is performed using the board 130B of FIG. 15.

As described above, when the board 130B having a non-flat surface in contact with the photoresist 140 is used, the coating 142A having various three-dimensional shapes can be obtained.

FIGS. 17 to 20 are views for explaining steps of an LED coating method in accordance with a third exemplary embodiment of the present invention, particularly showing a method of forming a molding 144 at an LED 120 on which a coating 142 having a phosphor is formed.

Figure 17:
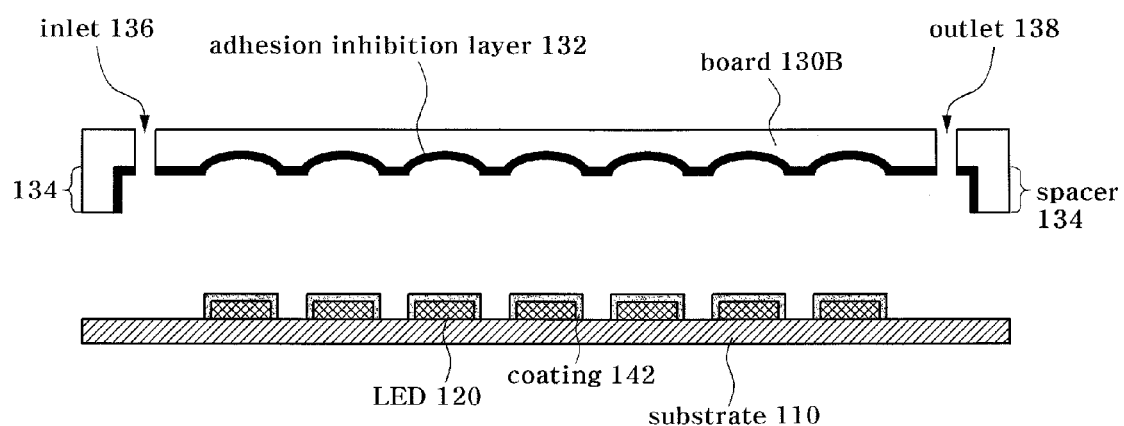
FIGS. 17 to 20 are views for explaining steps of an LED coating method in accordance with a third exemplary embodiment of the present invention, showing a method of forming a molding 144 at an LED 120 on which a coating 142 having a phosphor is formed.

Referring to FIG. 17, a substrate 110, a plurality of LEDs 120 arranged on the substrate 110, a coating 142 formed on the surfaces of the plurality of LEDs 120 and the coating 142 having a phosphor, and a board 130B are prepared.

Since the substrate 110 and the plurality of LEDs 120 are substantially the same as in the first and second embodiments of the present invention, detailed descriptions thereof will be omitted for the convenience of description.

While the coating 142 may be a coating formed by the first or second embodiment of the present invention, it is not limited thereto, and may be a coating formed by the conventional art. The coating 142 may include a phosphor.

The board 130B is substantially the same as, for example, the board 130B shown in FIG. 15, but it is not limited thereto. As another example, the board 130 in FIG. 12 used in the second embodiment of the present invention may be used instead of the board 130B of FIG. 17. As another example, similar to the first embodiment of the present invention, the board may be omitted.

Figure 18:
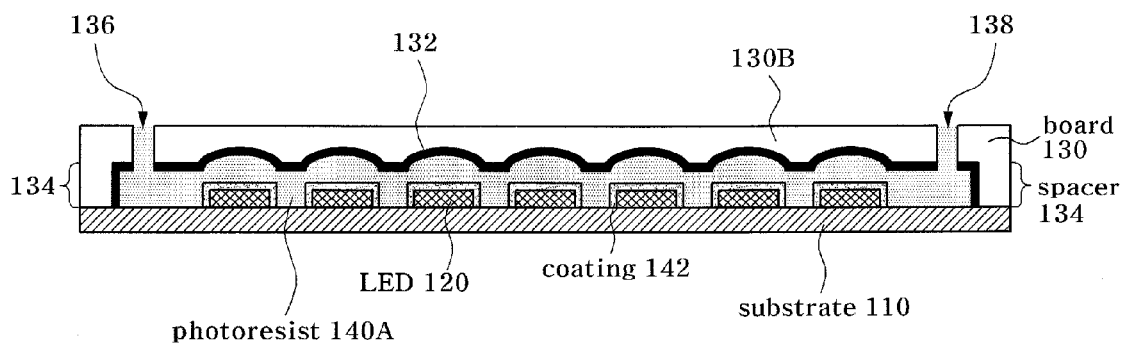

Referring to FIG. 18, a photoresist 140A is interposed between the substrate 110 and the board 130B, which are disposed parallel to each other to sandwich the plurality of LEDs 120.

Various kinds of photoresists may be used as the photoresist 140, which may not include a phosphor.

Figure 19:
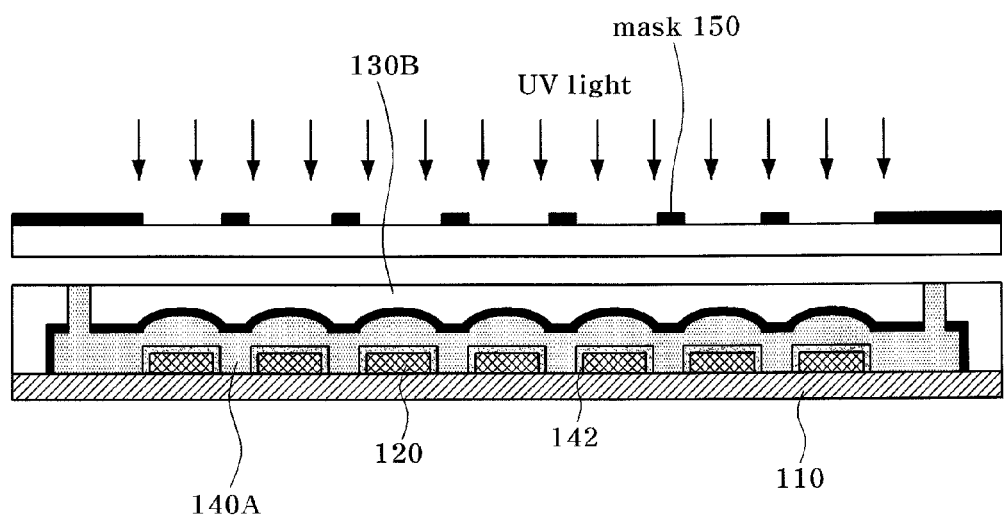

Referring to FIG. 19, the photoresist 140A is selectively exposed.

While the drawings show an example of selectively providing light to the photoresist 140A using a separate mask 150, any method of selectively providing light to the photoresist 140A may be used.

While the drawings show an example in which ultraviolet light is irradiated, the present invention is not limited thereto. While the drawings show an example in which a negative resist is used as the photoresist 140A, a positive resist may be used.

Figure 20:
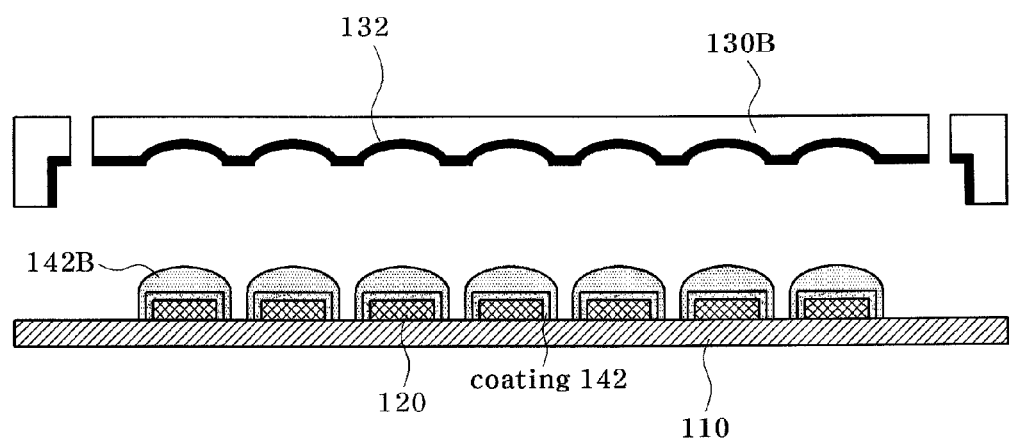

Referring to FIG. 20, after separating the board 130B from the substrate 110, the photoresist is developed to form a molding 142B on the surface of the coating 142. The molding 142b corresponds to the cured photoresist 140A.

While this invention has been described with reference to exemplary embodiments thereof, it will be clear to those of ordinary skill in the art to which the invention pertains that various modifications may be made to the described embodiments without departing from the spirit and scope of the invention as defined in the appended claims and their equivalents.

The invention claimed is:

1. A light emitting diode (LED) coating method, comprising:
   (a) preparing substrate and a plurality of LEDs arranged on the substrate;
   (b) applying a photoresist onto the substrate and the plurality of LEDs; and
   (c) selectively exposing the photoresist to light to form a first coating on surfaces of the plurality of LEDs, wherein, in step (b), a second coating including a phosphor is formed on surfaces of the plurality of LEDs.

2. The LED coating method according to claim 1, wherein the photoresist comprises a phosphor.

3. The LED coating method according to claim 1, wherein, in step (c), the photoresist is selectively exposed to light using a mask.

4. The LED coating method according to claim 1, wherein the thickness of the first coating disposed at side surfaces of each LED of the plurality of LEDs is adjusted by a horizontal gap between the LED and the mask.

5. The LED coating method according to claim 1, wherein a portion of each upper surface of the plurality of LEDs is not covered by the first coating.

6. The LED coating method according to claim 1, wherein a portion of each upper surface of the plurality of LEDs for contact with a bonding wire is not covered by the first coating.

7. A light emitting diode (LED) coating method, comprising:
   (a) preparing a substrate, a plurality of LEDs arranged on the substrate, and a board;
   (b) introducing a photoresist between the substrate and the board, which are disposed parallel to each other, to sandwich the plurality of LEDs; and
   (c) selectively exposing the photoresist to light to form a first coating on surfaces of the plurality of LEDs, wherein the first coating is formed by curing the photoresist,
   wherein, in step (b), a second coating including a phosphor is formed on surfaces of the plurality of LEDs.

8. The LED coating method according to claim 7, wherein the photoresist comprises a phosphor.

9. The LED coating method according to claim 7, wherein a portion of the board is transparent and other portions thereof are opaque, and thus the board is used as a mask for selective exposure of step (c).

10. The LED coating method according to claim 7, wherein an adhesion inhibition layer is formed on a surface of the board facing the LEDs.

11. The LED coating method according to claim 7, wherein the thickness of the first coating disposed on the upper surfaces of the plurality of LEDs is adjusted by a distance between the substrate and the board.

12. The LED coating method according to claim 7, wherein a portion of each upper surface of the plurality of LEDs is not covered by the first coating.

13. The LED coating method according to claim 7, wherein a portion of each upper surface of the plurality of LEDs for contact with a bonding wire is not covered by the first coating.

14. The LED coating method according to claim 7, wherein the board has a non-flat surface in contact with the photoresist.

15. The LED coating method according to claim 10, wherein the adhesion inhibition layer comprises an oxygen transmission layer.

16. A light emitting diode (LED) light source, comprising:
   a substrate;
   an LED disposed on the substrate;
   a first coating covering at least a portion of the LED, the first coating including a cured photoresist and
   a second coating including a phosphor formed on surfaces of the LED.

17. The LED light source according to claim 16, wherein the first coating comprises a phosphor.

18. The LED light source according to claim 16, wherein the first coating does not cover a portion of an upper surface of the LED.

19. The LED light source according to claim 16, wherein the first coating is obtained by selectively exposing the photoresist, after applying the photoresist onto the substrate and the LED.

20. The LED light source according to claim 16, wherein the first coating is obtained by selectively exposing the photoresist, after introducing the photoresist between the substrate and t-he a_board, which are disposed parallel to each other, to sandwich the LED.

21. The LED light source according to claim 18, wherein the portion comprises a region used for contact with a bonding wire.

22. A light emitting diode (LED) coating method, comprising:
   (a) preparing a substrate and a plurality of LEDs arranged on the substrate;
   (b) applying a photoresist onto the substrate and the plurality of LEDs; and
   (c) selectively exposing the photoresist to light to form a first coating on surfaces of the plurality of LEDs, wherein the first coating is formed by curing the photoresist,
   wherein a portion of each upper surface of the plurality of LEDs is not covered by the first coating while another portion of each upper surface of the plurality of LEDs is covered by the first coating.

23. The LED coating method according to claim 22, wherein the photoresist comprises a phosphor.

24. The LED coating method according to claim 22, wherein, in step (c), the photoresist is selectively exposed to light using a mask.

25. The LED coating method according to claim 22, wherein the thickness of the first coating disposed at side surfaces of each LED of the plurality of LEDs is adjusted by a horizontal gap between the LED and the mask.

26. The LED coating method according to claim 22, wherein the portion of each upper surface of the plurality of LEDs which is not covered by the first coating is for contact with a bonding wire.

27. A light emitting diode (LED) coating method, comprising:
   (a) preparing a substrate, a plurality of LEDs arranged on the substrate, and a board disposed over and above the plurality of LEDs to be substantially parallel to the substrate to sandwich the plurality of LEDs;
   (b) introducing a photoresist to fill a gap between the substrate and the board;
   and
   (c) selectively exposing the photoresist to light to form a first coating on surfaces of the plurality of LEDs, wherein the first coating is formed by curing the photoresist,
   wherein a thickness of the first coating disposed on an upper surface of each of the plurality of LEDs is adjusted by a distance between the substrate and the board.

28. The LED coating method according to claim 27, wherein the photoresist comprises a phosphor.

29. The LED coating method according to claim 27, wherein, in step (a), a second coating including a phosphor is formed on surfaces of the plurality of LEDs.

30. The LED coating method according to claim 27, wherein a portion of the board is transparent and other portions thereof are opaque, and thus the board is used as a mask for selective exposure of step (c).

31. The LED coating method according to claim 27 wherein an adhesion inhibition layer is formed on a surface of the board facing the LEDs.

32. The LED coating method according to claim 27, wherein a portion of each upper surface of the plurality of LEDs is not covered by the first coating while another portion of each upper surface of the plurality of LEDs is covered by the first coating.

33. The LED coating method according to claim 27, wherein a portion of each upper surface of the plurality of LEDs for contact with a bonding wire is not covered by the first coating.

34. The LED coating method according to claim 27, wherein the board has a non-flat surface in contact with the photoresist.

35. The LED coating method according to claim 31, wherein the adhesion inhibition layer comprises an oxygen transmission layer.

36. A light emitting diode (LED) light source, comprising:
   a substrate;
   an LED disposed on the substrate; and
   a coating for covering at least a portion of the LED, the coating including a cured photoresist,
   wherein the coating does not cover a portion of an upper surface of the LED while covering another portion of the upper surface of the LED.

37. The LED light source according to claim 36, wherein the coating comprises a phosphor.

38. The LED light source according to claim 36, wherein the portion of the upper surface of the LED which is not covered by the coating includes a region for contact with a bonding wire.

39. The LED light source according to claim 36, wherein the coating is obtained by selectively exposing the photoresist, after applying the photoresist onto the substrate and the LED.

40. The LED light source according to claim 36, wherein the coating is obtained by selectively exposing the photoresist, after introducing the photoresist between the substrate and the board, which are disposed parallel to each other, to sandwich the LED.

* * * * *